United States Patent
Edelstein et al.

(10) Patent No.: US 8,658,533 B2
(45) Date of Patent: Feb. 25, 2014

(54) SEMICONDUCTOR INTERCONNECT STRUCTURE WITH MULTI-LAYERED SEED LAYER PROVIDING ENHANCED RELIABILITY AND MINIMIZING ELECTROMIGRATION

(75) Inventors: Daniel C Edelstein, White Plains, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 13/044,660

(22) Filed: Mar. 10, 2011

(65) Prior Publication Data

US 2012/0228771 A1 Sep. 13, 2012

(51) Int. Cl.
H01L 23/48 (2006.01)
H01L 23/52 (2006.01)
H01L 29/40 (2006.01)
H01L 21/44 (2006.01)

(52) U.S. Cl.
USPC .............. 438/653; 257/751; 257/E21.584

(58) Field of Classification Search
USPC ............... 438/653; 118/725; 257/751
See application file for complete search history.

(56) References Cited

U.S. PATENT DOCUMENTS

| | | | |
|---|---|---|---|
| 6,306,776 B1 | 10/2001 | Srinivasan et al. | |
| 6,399,496 B1 | 6/2002 | Edelstein et al. | |
| 6,720,262 B2 | 4/2004 | Koh et al. | |
| 6,740,580 B1 | 5/2004 | Gupta et al. | |
| 7,247,946 B2 | 7/2007 | Bruley et al. | |
| 7,642,189 B2 | 1/2010 | Chang et al. | |
| 7,651,943 B2 | 1/2010 | Yu et al. | |
| 2001/0019891 A1* | 9/2001 | Koh et al. | 438/687 |
| 2003/0143837 A1* | 7/2003 | Gandikota et al. | 438/629 |
| 2003/0176011 A1* | 9/2003 | Niira et al. | 438/96 |
| 2003/0194881 A1* | 10/2003 | Totsuka et al. | 438/791 |
| 2005/0124153 A1* | 6/2005 | Cohen | 438/634 |
| 2005/0215053 A1* | 9/2005 | Soininen et al. | 438/658 |
| 2006/0138670 A1* | 6/2006 | Lee | 257/762 |
| 2007/0264816 A1 | 11/2007 | Lavoie et al. | |
| 2008/0124924 A1 | 5/2008 | Naik | |
| 2009/0004385 A1 | 1/2009 | Blackwell et al. | |
| 2009/0277386 A1 | 11/2009 | Takagi et al. | |

OTHER PUBLICATIONS

E. Kondoh et al., "Interconnection Formation by Doping Chemical-Vapor-Deposition Aluminum with Copper Simultaneously: Al-Cu CVD," J. Electrochem. Soc., vol. 141, No. 12, Dec. 1994, pp. 3494-3499.

* cited by examiner

Primary Examiner — Matthew Landau
Assistant Examiner — Igwe U Anya
(74) Attorney, Agent, or Firm — Isaac J. Gooshaw

(57) ABSTRACT

An interconnect structure and method for forming a multi-layered seed layer for semiconductor interconnections are disclosed. Specifically, the method and structure involves utilizing sequential catalytic chemical vapor deposition, which is followed by annealing, to form the multi-layered seed layer of an interconnect structure. The multi-layered seed layer will improve electromigration resistance, decrease void formation, and enhance reliability of ultra-large-scale integration (ULSI) chips.

6 Claims, 8 Drawing Sheets

SEMICONDUCTOR INTERCONNECT STRUCTURE WITH MULTI-LAYERED SEED LAYER PROVIDING ENHANCED RELIABILITY AND MINIMIZING ELECTROMIGRATION

TECHNICAL FIELD

The present invention relates to a semiconductor integrated circuit interconnect structure and method of forming a multi-layered seed layer of the interconnect structure to minimize electromigration, utilizing sequential catalytic chemical vapor deposition.

BACKGROUND

Semiconductor devices include a plurality of circuit components (i.e., transistors, resistors, diodes, capacitors, etc.) connected together to form an integrated circuit fabricated on a semiconductor substrate. A complex network of semiconductor integrated circuit interconnects (interconnects) are routed to connect the circuit components distributed on the surface of the substrate. Efficient routing of these interconnects, across semiconductor devices, requires formation of multi-level or multi-layered patterning schemes, such as single or dual damascene interconnect structures.

An interconnect structure includes metal vias that run perpendicular to the semiconductor substrate. The metal vias are disposed in trench areas. In addition, an interconnect structure includes metal lines that are disposed in the trench areas, wherein the trench areas are formed in dielectric material. The metal vias are connected to the metal lines, and the metal lines run parallel to the semiconductor substrate. Thus, both the metal lines and metal vias are disposed proximately to the dielectric material having a dielectric constant of less than 5.0, which enhances signal speed and minimizes signal crosstalk (i.e., crosstalk refers to a signal being transmitted through a metal line, and affecting another signal being transmitted through a separate metal line, and/or affecting other parts of circuitry in an undesired manner).

Furthermore, interconnect structures that are copper (Cu) based, when compared with aluminum (Al) based interconnect structures, provide higher speed signal transmission between large numbers of transistors on a complex semiconductor chip. Accordingly, when manufacturing integrated circuits, copper (i.e., a metal conductor) is typically used for forming the semiconductor integrated circuit's interconnects because of copper's low resistivity and high current carrying capacity. Resistivity is the measure of how much a material opposes electric current, due to a voltage being placed across the material. However, when copper is utilized to form interconnects electromigration may occur. Electromigration can result in void formation, as well as extrusion/hillock formation. Integrated circuit manufacturers generally have electromigration requirements that should be satisfied as part of an overall quality assurance validation process, but thereafter electromigration may still persist during the lifetime of an integrated circuit in a user's computer (i.e., when current flows through the semiconductor integrated circuit's interconnect structure).

Specifically, electromigration is the gradual displacement of atoms of a metal conductor, due to high density of current passing through the metal conductor, and electromigration is accelerated when the temperature of the metal conductor increases. Since a semiconductor integrated circuit's interconnect structure is generally formed using copper, which is a metal conductor susceptible to electromigration, electromigration presents a problem when utilizing integrated circuits with copper based interconnects.

Electromigration (i.e., the gradual displacement of metal atoms from one location to another location throughout a metal conductor, due to the high density of current flow) can result in void formation, as well as extrusion/hillock formation in a semiconductor integrated circuit's interconnect structure. The voids can result in an open circuit if one or more voids formed are large enough to sever the interconnect structure, and the extrusions/hillocks can result in a short circuit if one or more extrusions/hillocks are sufficiently long to form a region of abnormally low electrical impedance. Accordingly, void formation and extrusion/hillock formation, due to electromigration, can reduce integrated circuit performance, decrease reliability of interconnects, cause sudden data loss, and reduce the useful life of semiconductor integrated circuit products.

SUMMARY

The present invention relates to a semiconductor integrated circuit interconnect structure (interconnect structure) and method of forming the interconnect structure to minimize electromigration. Minimizing electromigration can improve integrated circuit performance, enhance reliability of interconnect structures, minimize sudden data loss, and enhance the useful lifetime of semiconductor integrated circuit products.

A first aspect of the present invention provides an interconnect structure comprising: one or more openings in a dielectric layer; a barrier metal layer disposed on the dielectric layer; a multi-layered seed layer disposed on the barrier metal layer, wherein the multi-layered seed layer comprises at least three layers; an electroplated copper layer disposed on the multi-layered seed layer; a planarized surface, wherein a portion of the barrier metal layer, the multi-layered seed layer, and the electroplated copper layer are removed; and a capping layer disposed on the planarized surface.

A second aspect of the present invention provides a method of performing a sequential catalytic chemical vapor deposition (CVD) process by utilizing a catalytic CVD apparatus, the method comprising the steps of: forming one or more openings in a dielectric layer; forming a barrier metal layer disposed on the dielectric layer; forming a multi-layered seed layer disposed on the barrier metal layer, wherein the multi-layered seed layer comprises at least three layers; forming an electroplated copper layer disposed on the multi-layered seed layer; forming a planarized surface, wherein a portion of the barrier metal layer, the multi-layered seed layer, and the electroplated copper layer are removed; and forming a capping layer disposed on the planarized surface.

A third aspect of the present invention provides a catalytic chemical vapor deposition apparatus comprising: a catalytic chemical vapor deposition (CVD) processing chamber, wherein the catalytic CVD processing chamber comprises a heatable metal wire, a heatable plate; and a heatable tank operatively coupled to the catalytic CVD processing chamber.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1:
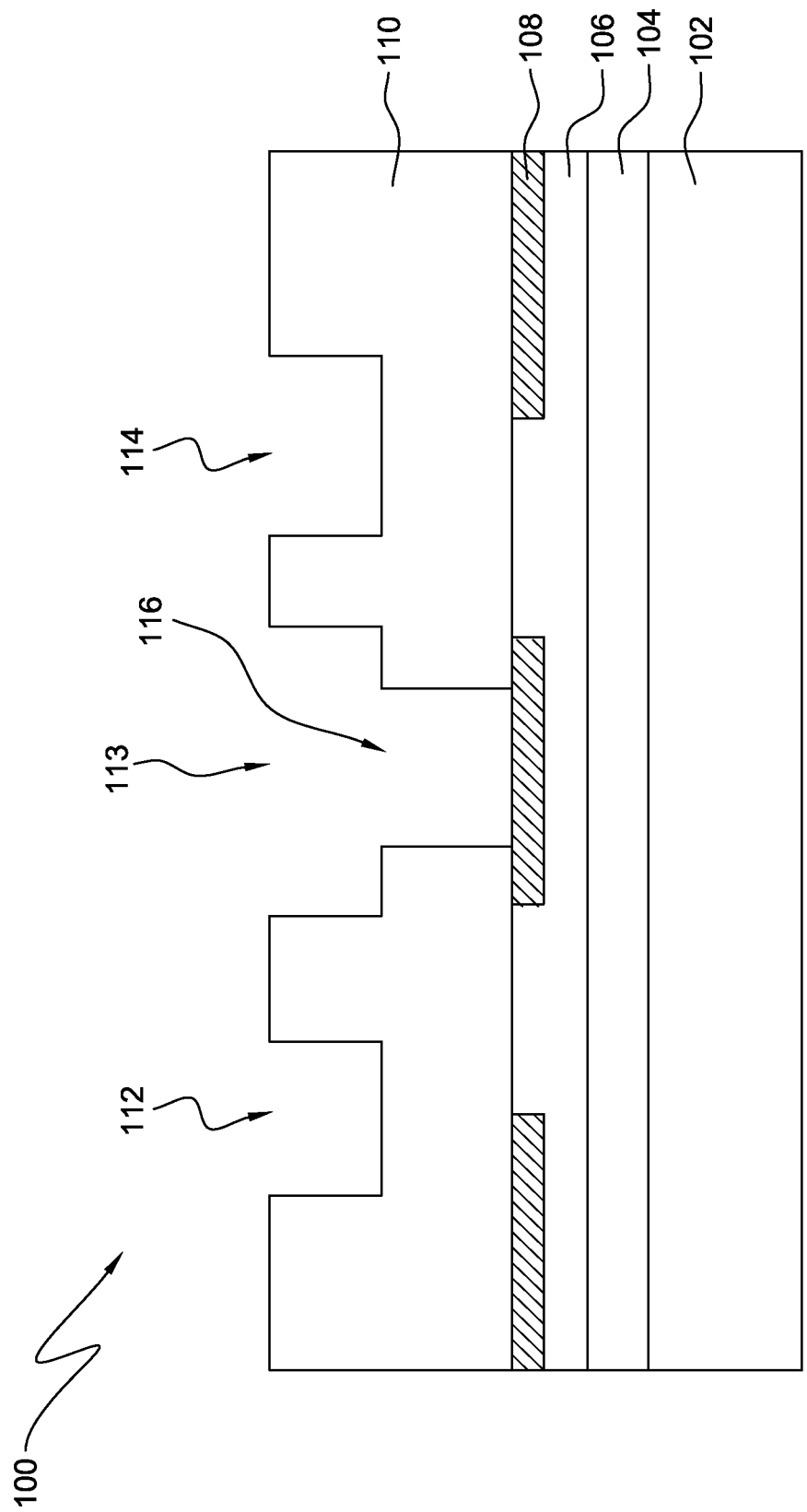
FIG. 1 is a pictorial representation (i.e., cross-sectional view) of a semiconductor illustrating the formation of trench areas and via holes (i.e., vias) according to one embodiment of the present invention.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition it will be understood that when an element as a layer, region, or substrate is referred to as being "on" or "over", or "disposed on" another element, it can be directly on the other element or intervening elements may also be present. In contrast, when an element is referred to as being "directly on", "directly over", or "disposed proximately to" another element, there are no intervening elements present. It will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provides a semiconductor integrated circuit interconnect structure (interconnect structure) that minimizes electromigration, which thereby can minimize void formation and extrusion/hillock formation. Minimizing electromigration can improve integrated circuit performance, enhance reliability of interconnect structures, minimize sudden data loss, and enhance the useful lifetime of semiconductor integrated circuit products.

FIG. 1 illustrates a cross-sectional view of semiconductor 100 comprising a substrate 102, transistor area layer 104, first dielectric layer 106, first metal layer 108, second dielectric layer 110, and openings in the second dielectric layer 110 for trench areas 112-114 and via hole 116. Specifically, dielectric layer 106 is formed on transistor area layer 104, wherein transistor area layer 104 is formed on substrate 102. Subsequent to a chemical-mechanical planarization (CMP) process of the first dielectric layer 106 with first metal layer 108, a second dielectric layer 110 is formed over first metal layer 108 and first dielectric layer 106. Moreover, trench areas 112-114 and a via hole 116 are formed in second dielectric layer 110. Specifically, via hole 116 is formed in trench area 113. Consequently, a dual damascene structure, which includes trench areas 112-114 and a via hole 116, is formed.

Figure 2:
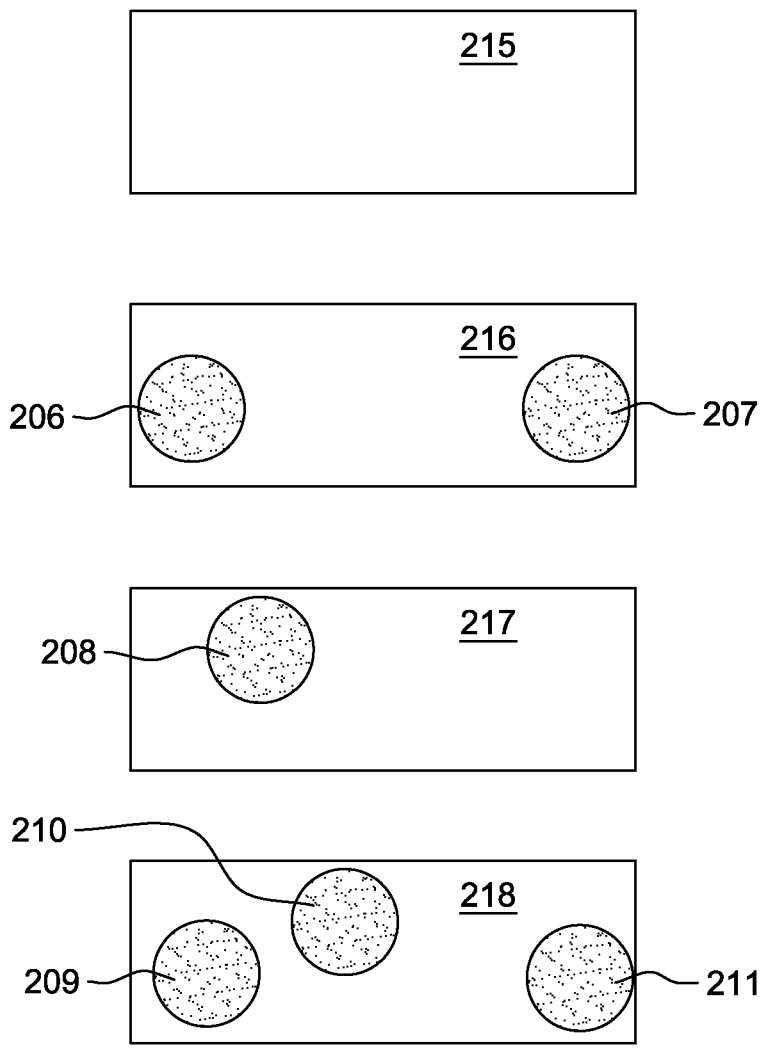
FIG. 2 depicts a top view of an array of trench areas and via holes (i.e., vias) according to one embodiment of the present invention.

FIG. 2 is a top view of an array of trench areas and via holes. Specifically, FIG. 2 depicts an array of trench areas 215-218 and via holes 206-211. A trench may not have any via holes such as trench area 215. However, trench areas can have one or more via holes such as depicted in trench areas 216-218. Moreover, via holes can be distributed uniformly in a trench area as illustrated in trench area 216, wherein in via hole 206 is formed symmetrically opposite to via hole 207, in trench area 216. Alternatively, via holes can be distributed non-uniformly in a trench area as illustrated in trench areas 217-218. Lastly, there are one or more via holes at each level of semiconductor interconnects in order for all levels of the semiconductor interconnects to be electrically connected.

Figure 3A:
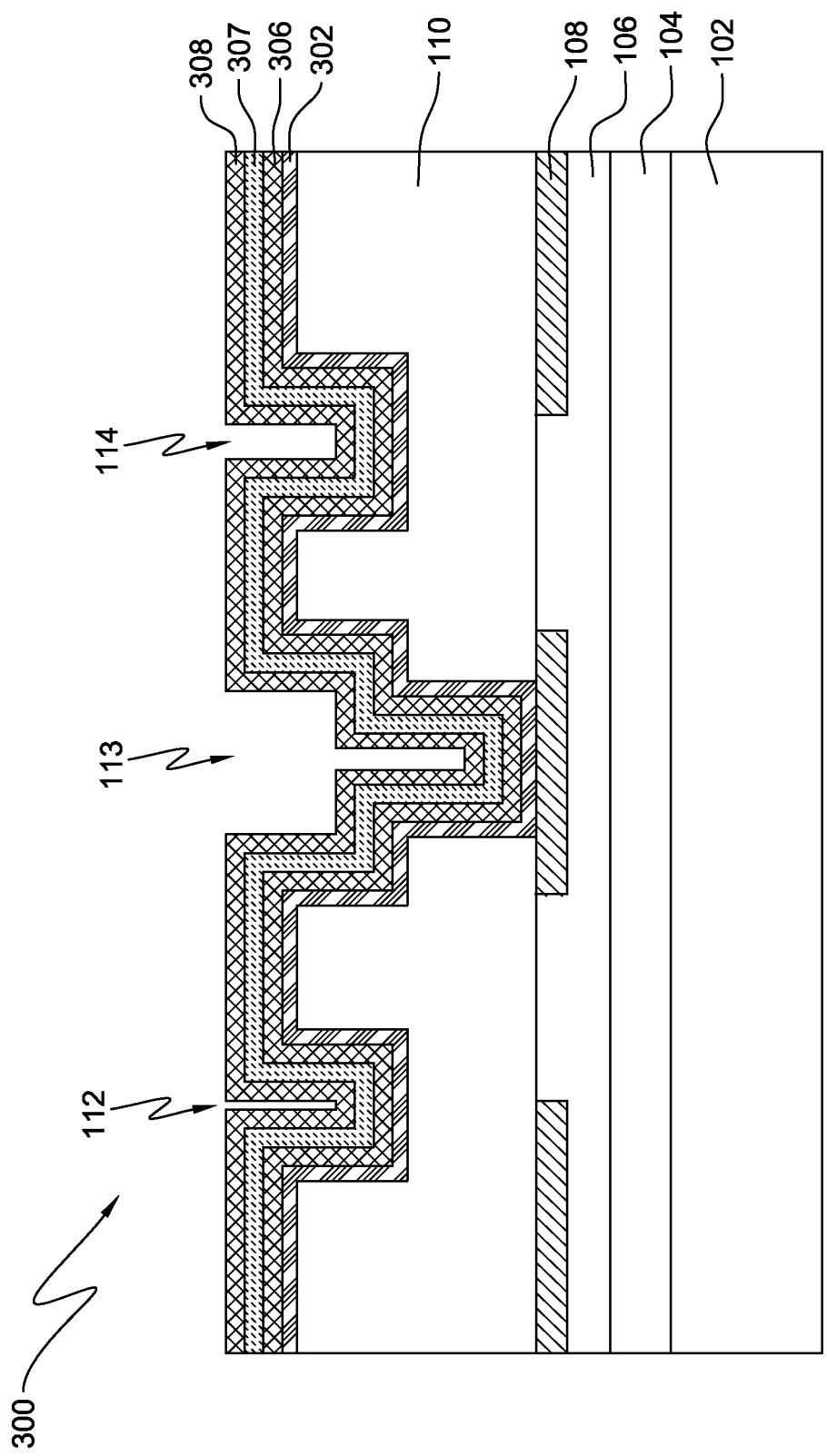
FIGS. 3A-3D are pictorial representations (i.e., cross-sectional views) illustrating the formation of trench areas and via holes with a barrier metal layer, a multi-layered seed layer, an electroplated copper layer, and a dielectric capping layer according to one embodiment of the present invention.

FIG. 3A depicts a cross-sectional view of substrate 102, transistor area layer 104, first dielectric layer 106, first metal layer 108, second dielectric layer 110, trench areas 112-114, via hole 116 (shown in FIG. 1), barrier metal layer 302, first copper seed layer 306, second seed layer 307, and second copper seed layer 308.

Specifically, the barrier metal layer 302 is disposed on trench areas 112-114. The barrier metal layer 302 prevents conducting material, such as copper, from diffusing into the dielectric layer 110. A multi-layered seed layer is formed directly on barrier metal layer 302. The multi-layered seed layer comprises a first copper seed layer 306, a second seed layer 307, and a second copper seed layer 308. The first copper seed layer 308 is formed utilizing a sequential catalytic chemical vapor deposition (CVD) process. Utilizing the sequential catalytic CVD process allows for trench areas and via holes to be filed, and minimizes pinch-offs, void formation, and extrusion/hillock formation. Specifically, to form first copper seed layer 306, copper(II) chloride and hydrogen gases are utilized in the sequential catalytic CVD process, wherein first copper seed layer 306 is disposed on barrier metal layer 302.

Next, second seed layer 307 is disposed on first copper seed layer 306 utilizing the sequential catalytic CVD process. Specifically, to form the second seed layer 307, hydrogen gas, ammonia gas, and carrier gas argon are utilized with manganese amidinate precursor. In the present embodiment manganese is utilized to form second seed layer 307, but in alternative embodiments aluminum, tin, or titanium may be utilized to form second seed layer 307. After the second seed layer 307 is formed, second copper seed layer 308 is formed utilizing the sequential catalytic CVD process, wherein the second copper seed layer 308 is disposed on second seed layer 307. Accordingly, the multi-layered seed layer is formed.

Figure 3B:
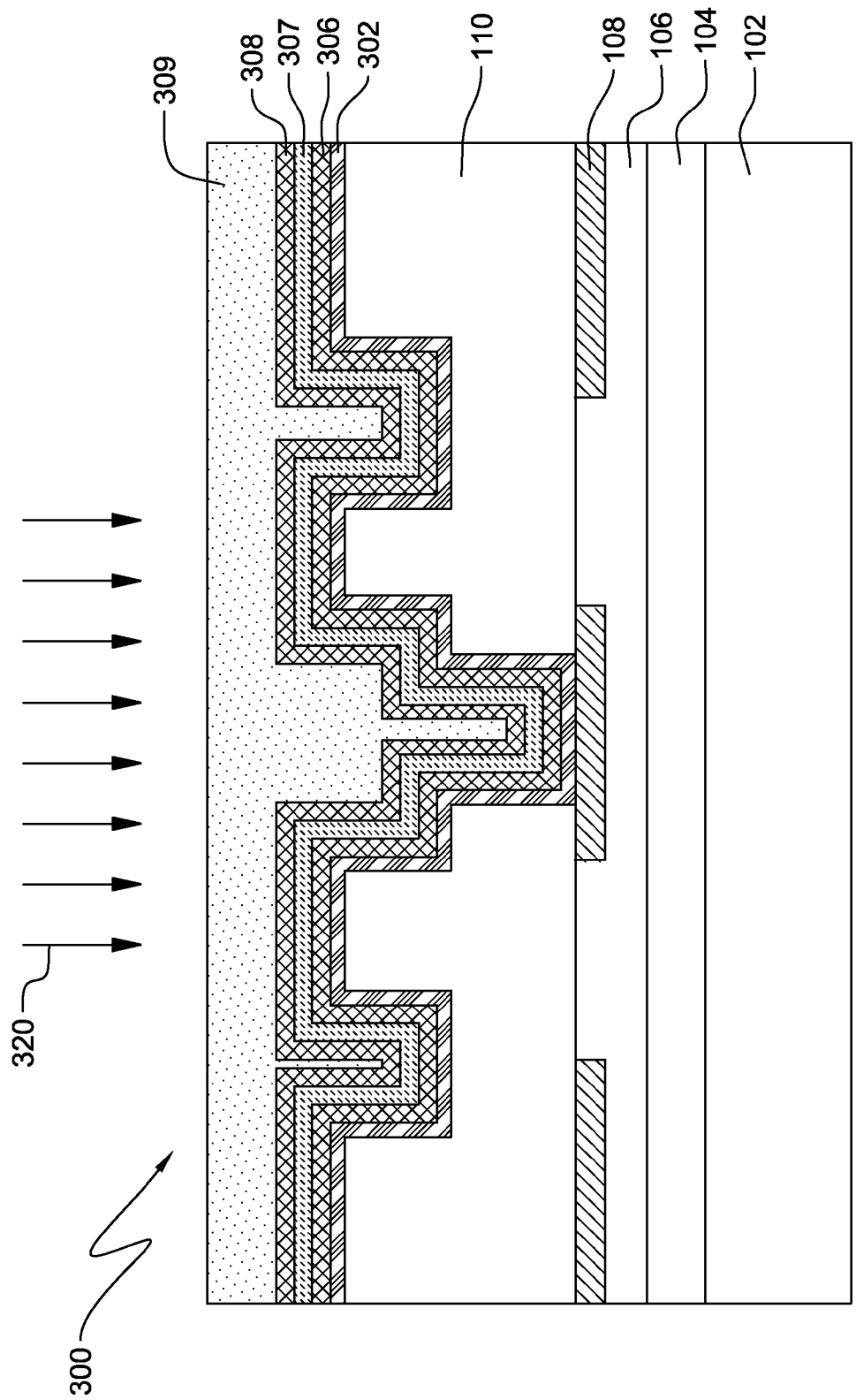

FIG. 3B illustrates the formation of an electroplated copper layer 309. Specifically, the electroplated copper layer 309 is disposed on the second copper seed layer 308. As a result, unfilled trench areas 112-114 (shown in FIG. 3A) and via hole 116 (shown in FIG. 1) are filled with copper, utilizing an electroplating technique. In addition, post plating anneal 320 occurs causing copper grain growth. However, the post plating anneal 320 does not result in much diffusion of the multi-layered seed layer.

Figure 3C:
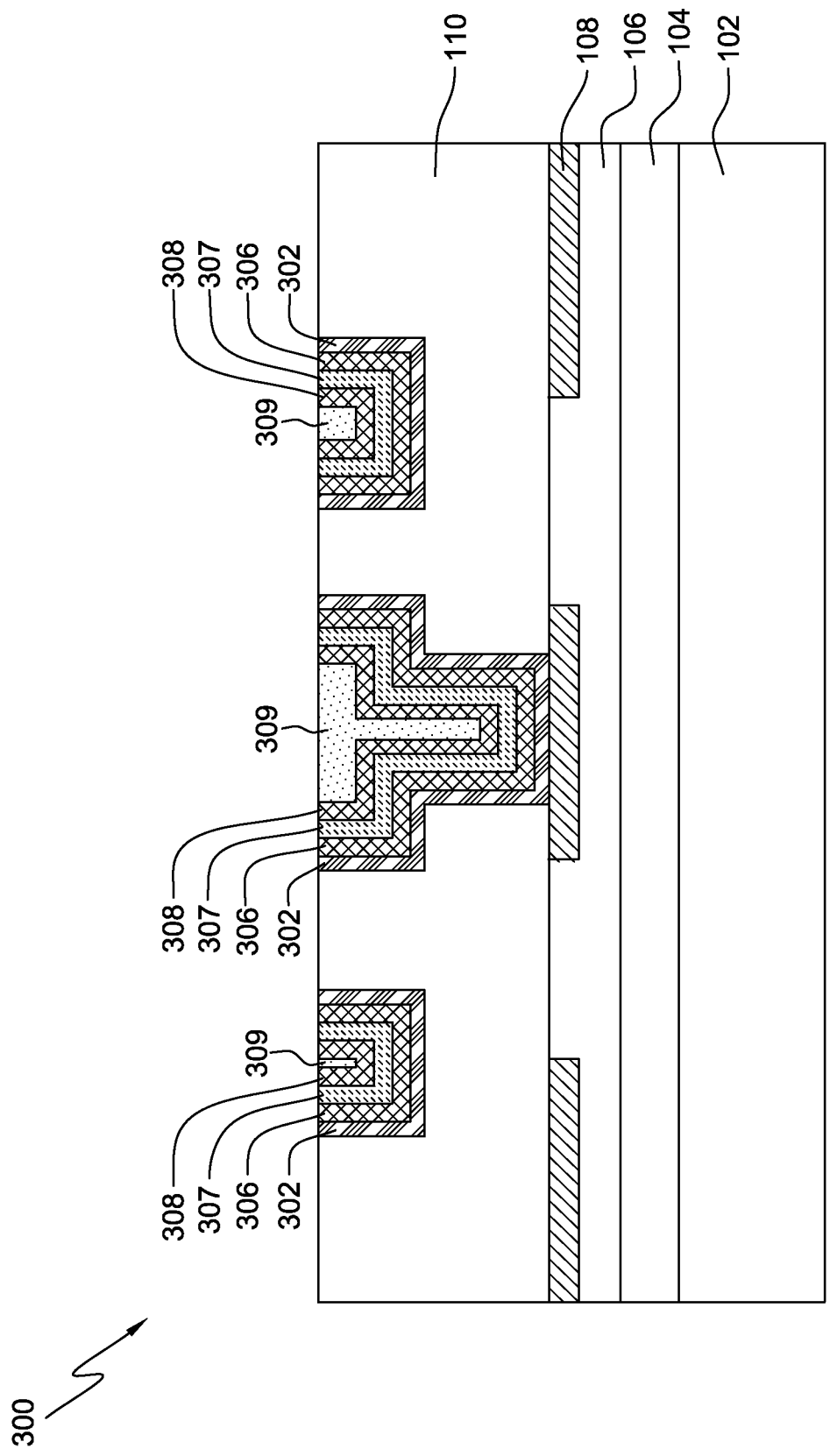

FIG. 3C illustrates an end result of a chemical-mechanical planarization (CMP) process. The purpose of the CMP process is to remove a portion of layers 302 and 306-308, which provides for the formation of a quality interconnect structure, and clears the way for forming a dielectric layer capping layer and/or a selective metal capping layer.

Figure 3D:
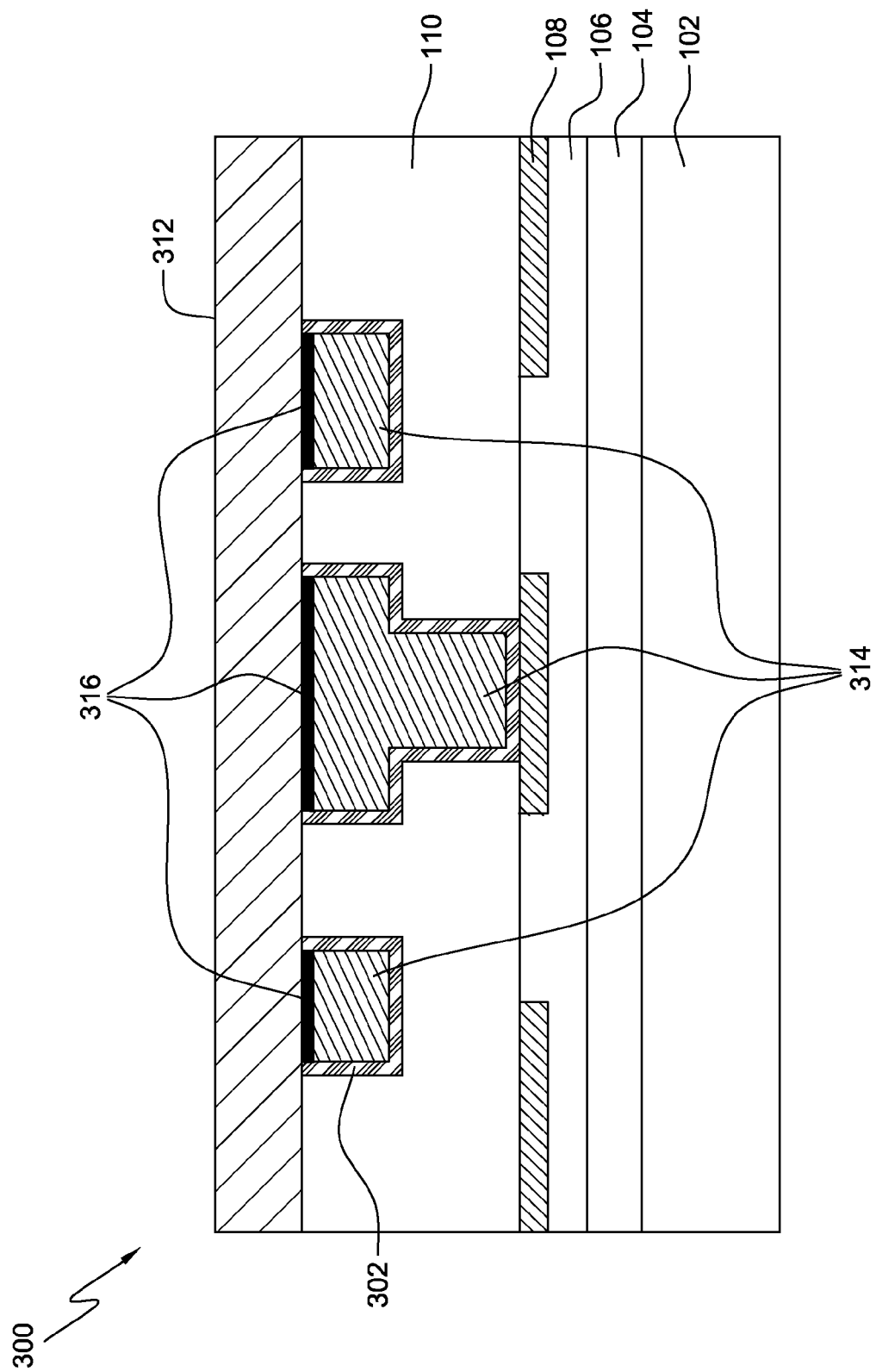

FIG. 3D illustrates the formation of a dielectric capping layer. In the present embodiment, dielectric capping layer 312 is formed after the CMP process illustrated in FIG. 3C. The dielectric capping process occurs at temperatures high enough (i.e., between about 350° C.-400° C.) to enhance copper grain growth of first copper seed layer 306 (shown in FIG. 3C) and second copper seed layer 308 (shown in FIG. 3C), and enhance diffusion of second seed layer 307 (shown in FIG. 3C) with seed layer 306, seed layer 308, and with electroplated copper layer 309 (shown in FIG. 3C). As a result, second seed layer 307 diffuses with first copper seed layer 306, diffuses with second copper seed layer 308, and diffuses with electroplated copper layer 309, which causes layers 306-309 to merge, forming a single second metal layer 314 comprising a copper-manganese alloy. Furthermore, as a result of the diffusion process, triggered by the formation of dielectric capping layer 312, a high concentration of manganese remains at the interface between dielectric capping layer 312 and second metal layer 314. Accordingly, the high concentration of manganese forms a segregated manganese-containing layer 316 at the interfaces between dielectric capping layer 312 and second metal layer 314. Additionally, a via hole opening can be created in dielectric capping layer 312 to provided connectivity to a subsequent metal layer. In alternative embodiments, a selective metal capping layer may be deposited over segregated manganese-containing layer 316, wherein subsequently a dielectric capping layer 312 may be deposited over the selective metal capping layer, and wherein the capping process occurs at temperatures between about 350° C.-400° C.

Figure 4:
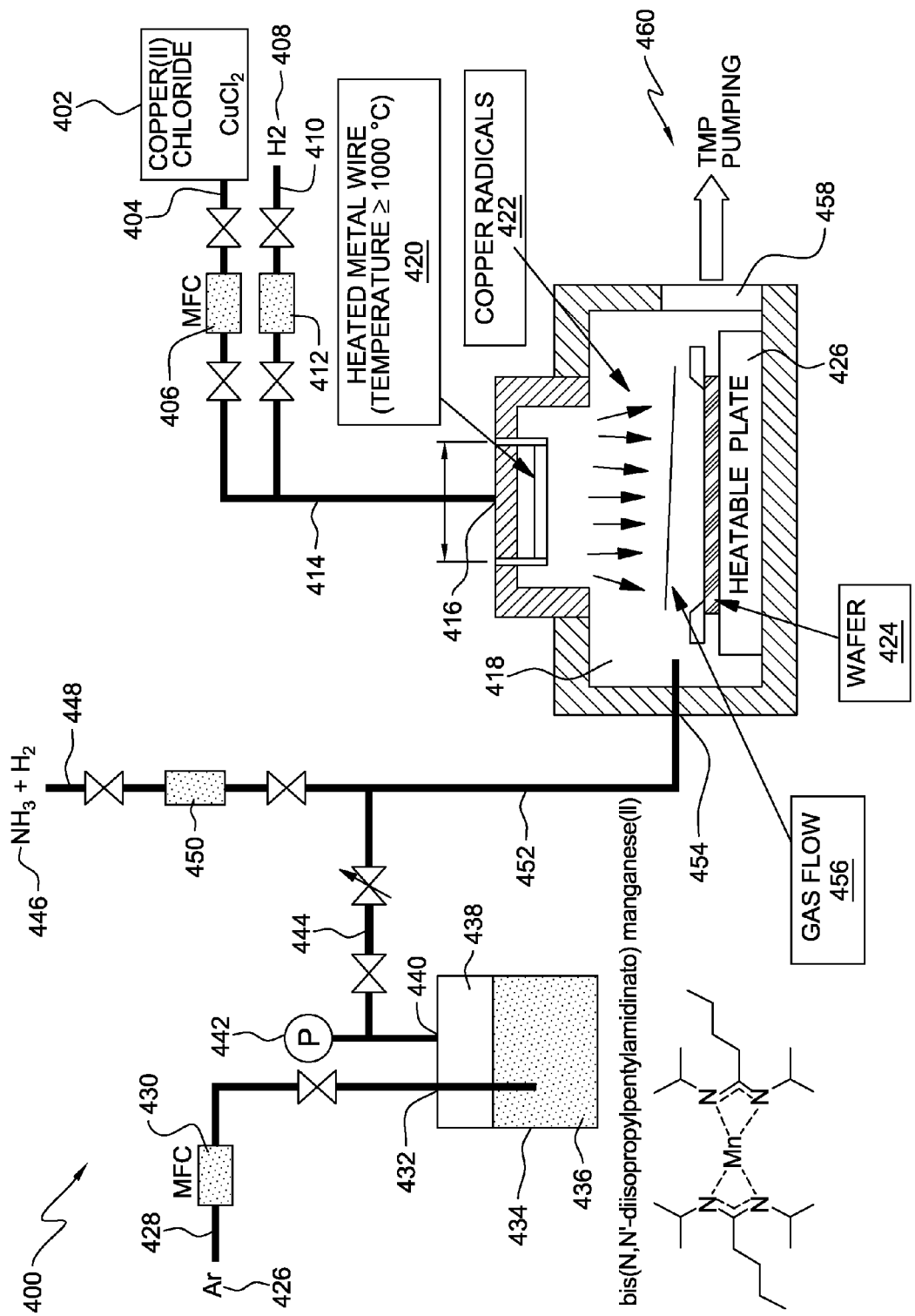
FIG. 4 depicts a cross-sectional view of a catalytic chemical vapor deposition (CVD) processing chamber and heatable tank adapted to deliver metal ions and precursor gases to a substrate according to one embodiment of the present invention.

FIG. 4 depicts a schematic cross-sectional view of a chemical deposition apparatus 400 comprising a catalytic chemical vapor deposition (CVD) processing chamber 418 and heatable tank 434, adapted to deliver metal ions and precursor gases to a substrate, and adapted to form a multi-layered seed layer. Gas line 404 is utilized to deliver copper(II) chloride gas 402 into gas line 414. The gas line 404 is connected to a mass flow controller 406, and a gas line 414. The copper(II) chloride gas 402 passes through gas line 404, mass flow controller 406, and then into the gas line 414. The purpose of a mass flow controller is to control the rate of gas flow through a gas line. Gas line 410 is utilized to deliver hydrogen gas 408 into gas line 414. The gas line 410 is connected to a mass flow controller 412, and the gas line 414. The hydrogen gas 408 passes through gas line 410, mass flow controller 412, and then into the gas line 414. In one embodiment, a gas line 410 is utilized to deliver hydrogen gas 408 into gas line 414, wherein gas line 404 is simultaneously utilized to deliver the copper(II) chloride gas 402 into gas line 414.

Accordingly, gas lines 404 and 410 merge into one gas line 414, wherein gas line 414 is connected to inlet 416 of catalytic CVD processing chamber 418. Gas line 414 contains both copper(II) chloride gas 402 and hydrogen gas 408, which are introduced into the inlet 416 of catalytic CVD processing chamber 418. In one embodiment catalytic CVD processing chamber 418 comprises an inlet 416, a heated metal wire 420, a side inlet 454, a heatable plate 426, a wafer 424, and a gas discharge outlet 458 for gases to exit by turbo molecular pumping 460. In addition, a barrier metal layer 302 (shown in FIG. 3A) is disposed on the surface of wafer 424, wherein in the barrier metal layer 302 is deposited utilizing physical vapor deposition prior to entering catalytic CVD processing chamber 418. However, the barrier metal layer 302 can be deposited in a separate chamber by utilizing other processes, which include atomic layer deposition (ALD).

After the copper(II) chloride gas 402 and hydrogen gas 408 pass through gas line 414 and are introduced into inlet 416, the copper(II) chloride gas 402 and hydrogen gas 408 are then heated by metal wire 420. Metal wire 420 comprises tungsten, but can be made of other useful materials which include ruthenium, rhodium, palladium, osmium, iridium, platinum, gold, silver, mercury, rhenium, copper or a combination thereof. At the surface of heated metal wire 420 the copper(II) chloride gas 402 reacts with the hydrogen gas 408, and the copper(II) chloride gas 402 decomposes into copper radicals 422. The copper radicals 422 are then deposited directly on to the surface of the barrier metal layer 302, to form first copper seed layer 306 (shown in FIG. 3A). Although the wafer 424 is directly on heatable plate 426, the plate is not very hot. Typically, CVD needs to occur at a high temperature, however in the present embodiment copper decomposition happens as a result of the heated metal wire 420, which forms copper radicals 422. Therefore, heatable plate 426 does not have to be heated to as a high temperature as other CVD processes may require. Specifically, the temperature of the heatable plate 426 may be between about 20° C.-150° C.

After first copper seed layer 306 is deposited on wafer 424, the catalytic CVD processing chamber 418 is cleaned. Next, gas line 428 is utilized to deliver a carrier gas 426 into heatable tank 434. In the present embodiment, the carrier gas argon 426 is utilized, but other gases may be used including nitrogen gas ($N_2$). Subsequently, gas line 428 delivers carrier gas argon 426 through a mass flow controller 430, and through inlet 432 of heatable tank 434, wherein the heatable tank 434 holds a manganese amidinate precursor 436. Thus, the carrier gas 426 is delivered into the manganese amidinate precursor 436. The manganese amidinate precursor 436 becomes liquid vaporized, which forms a vapor 438. The vapor 438 is discharged through outlet 440 of heatable tank 434, and introduced into gas line 444. The vapor 438 includes manganese amidinate precursor 436. Pressure gauge 442 is connected to gas line 444, and can be utilized to determine how much manganese amidinate precursor is in vapor 438. In the present embodiment, the manganese amidinate precursor 436 is utilized, but in alternative embodiments other liquid solutions may be utilized, which include carbonyl precursors.

Next, ammonia ($NH_3$) and hydrogen ($H_2$) gases 446 are introduced into gas line 448. The ammonia and hydrogen gases 446 pass through a mass flow controller 450. Gas line 448 merges with gas line 444 forming gas line 452, wherein gas line 452 is connected to side inlet 454 of catalytic CVD processing chamber 418. As a result, the vapor 438 flowing through gas line 444 merges with the ammonia and hydrogen gases 446 flowing through gas line 448, wherein the combined vapor 438 and ammonia and hydrogen gases 446 then flow through gas line 452. Gas line 452 delivers the combined vapor 438 and ammonia and hydrogen gases 446 into catalytic CVD processing chamber 418, through side inlet 454 forming a stream of gas flow 456. At the top surface of first copper seed layer 306 the combined vapor 438 and ammonia and hydrogen gases 446 cause the manganese amidinate precursor 436 in vapor 438 to decompose, wherein the manganese atoms of the manganese amidinate precursor 436 are separated from the nitrogen atoms of the manganese amidinate precursor 436. Thus, the manganese atoms are deposited directly on the top surface of first copper seed layer 306, forming a second seed layer 307. The ammonia and hydrogen gases 446 and nitrogen atoms, wherein the nitrogen atoms were once bonded to the manganese, are evacuated from processing chamber 418 through the gas discharge outlet 458 by utilizing a turbo molecular pumping 460. Accordingly, a second seed layer 307 (shown in FIG. 3C) is disposed on the top surface of first copper seed layer 306. In the present embodiment manganese is utilized to form precursor 436 and second seed layer 307, but in alternative embodiments aluminum, tin, or titanium may be utilized to form precursor 436 and second seed layer 307.

After second seed layer 307 is disposed on the top surface of first copper seed layer 306, the catalytic CVD processing chamber 418 is cleaned. Next, copper(II) chloride gas 402 is introduced into gas line 404, and hydrogen gas 408 is introduced into gas line 410. The copper(II) chloride gas 402 passes through mass flow controller 406 and the hydrogen gas 408 passes through mass flow controller 412.

Next, gas lines 404 and 410 merge into one gas line 414, wherein gas line 414 is connected to inlet 416 of catalytic CVD processing chamber 418. Thus, gas line 414 contains both copper(II) chloride gas 402 and hydrogen gas 408, which are introduced into the inlet 416 of catalytic CVD processing chamber 418. In one embodiment catalytic CVD processing chamber 418 comprises an inlet 416, a heated metal wire 420, a side inlet 454, a heatable plate 426, a wafer 424, and a gas discharge outlet 458 for gases to exit by turbo molecular pumping 460.

After the copper(II) chloride gas 402 and hydrogen gas 408 pass through gas line 414 and are introduced into inlet 416, the copper(II) chloride gas 402 and hydrogen gas 408 are then heated by metal wire 420. The metal wire 420 may be heated between about 1000° C.-1500° C. Metal wire 420 comprises tungsten. At the surface of heated metal wire 420 the copper (II) chloride gas 402 reacts with the hydrogen gas 408, and the copper(II) chloride gas decomposes into copper radicals 422. The copper radicals 422 are then deposited directly on the surface of the second seed layer 307, to form second copper seed layer 308 (shown in FIG. 3A). Although the wafer 424 is directly on heatable plate 426, the plate is not very hot. Typically, CVD needs to occur at a high temperature, however in the present embodiment copper decomposition happens as a result of the heated metal wire 420, which forms copper radicals 422. Therefore, heatable plate 426 does not have to be heated to as a high temperature as other CVD processes may require. After forming of the second copper seed layer 308, the formation of the multi-layered seed layer is completed. Next an electroplated copper layer is formed in a separate chamber. Subsequently, in the present embodiment, processes such as chemical-mechanical planarization and the formation of dielectric capping layer 312 (shown in FIG. 3D) may be initiated. In alternative embodiments, a selective metal capping layer may be deposited over segregated manganese-containing layer 316, wherein subsequently a dielectric capping layer 312 may be deposited over the selective metal capping layer, and wherein the capping process occurs at temperatures between about 350° C.-400° C.

Figure 5:
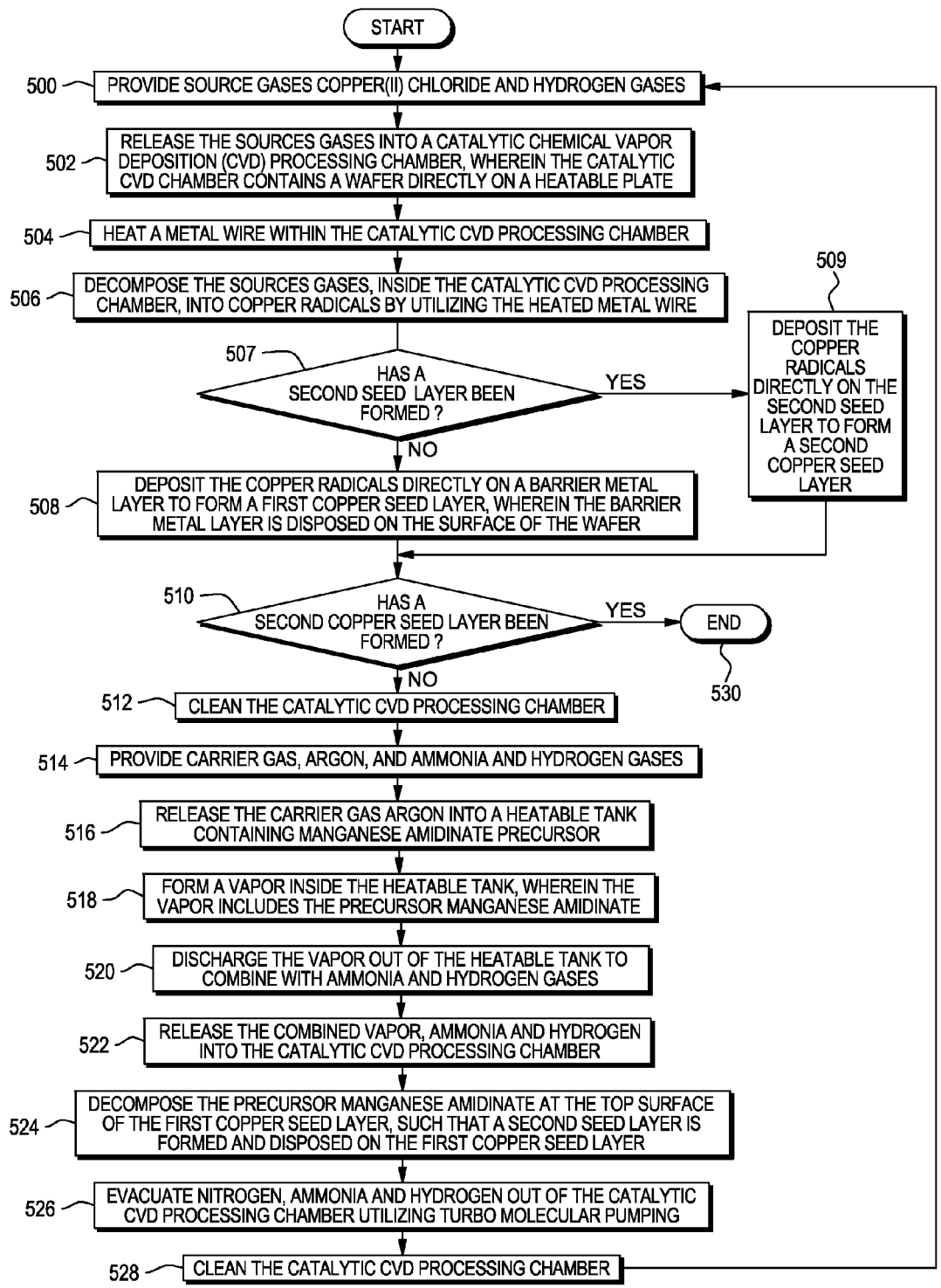
FIG. 5 is a method flow block diagram illustrating a method for forming a multi-layered seed layer of a semiconductor integrated circuit interconnect structure according to one embodiment of the present invention.

Referring now to FIG. 5, a method for forming a semiconductor integrated circuit interconnect structure with a multi-layered seed layer is depicted. In step 500, source gases which include copper(II) chloride gas 402 (shown in FIG. 4) and hydrogen gas 408 (shown in FIG. 4) are provided. In step 502, the source gases are released into a catalytic chemical vapor deposition chamber 418 (shown in FIG. 4), wherein the catalytic CVD processing chamber 418 includes a wafer directly on a heatable plate 426 (shown in FIG. 4). In step 504, a metal wire 420 (shown in FIG. 4) is heated. Next, in step 506 the metal wire 420 that is sufficiently heated causes the copper(II) chloride gas 402 to react with the hydrogen gas 408, at the surface of metal wire 420, such that the copper(II) chloride gas 402 decomposes into copper radicals 422 (shown in FIG. 4). In step 507, a determination is made as to whether a second seed layer 307 (shown in FIG. 3A) has been formed. Since a second seed layer 307 has not been formed the process will proceed to step 508. In step 508, the copper radicals 422 are deposited directly on a barrier metal layer 302 (shown in FIG. 3A), wherein in the barrier metal layer 302 is disposed on the surface of the wafer 424 (shown in FIG. 4), and wherein a first copper seed layer 306 (shown in FIG. 3A) is formed. In step 510, a determination is made as to whether a second copper seed layer has been formed. Since a second copper seed layer 308 (shown in FIG. 3A) has not been formed the process will proceed to step 512, wherein the catalytic CVD processing chamber 418 is cleaned in preparation for the next step in the formation of the multi-layered seed layer.

In step 514, a carrier gas argon 426 (shown in FIG. 4), and ammonia and hydrogen gases 446 (shown in FIG. 4) are provided. In step 516, the carrier gas argon 426 is released into a heatable tank 434 (shown in FIG. 4), wherein the heatable tank 434 contains manganese amidinate precursor 436 (shown in FIG. 4). In step 518, a vapor 438 (shown in FIG. 4) is formed inside of heatable tank 434, and the vapor 438 includes the manganese amidinate precursor 436. In step 520, the vapor 438 is discharged out of heatable tank 434 and combines with the ammonia and hydrogen gases 446. In step 522, the combined vapor 438, and ammonia and hydrogen gases 446 are released into the catalytic chemical vapor deposition chamber 418. In step 524, the manganese amidinate precursor 436 is decomposed at the top surface of copper seed layer 306. Specifically, in step 524, at the top surface of copper seed layer 306 the combined vapor 438 and ammonia and hydrogen gases 446 cause the manganese amidinate precursor 436 to decompose, wherein the manganese atoms of the manganese amidinate precursor 436 are separated from the nitrogen atoms of the manganese amidinate precursor 436. Thus, the manganese atoms are deposited directly on the top surface of first copper seed layer 306, forming a second seed layer 307. Next, in step 526, nitrogen, and ammonia and hydrogen gases 446 are evacuated from the catalytic CVD processing chamber 418 by utilizing turbo molecular pumping 460. In step 528, the catalytic CVD processing chamber 418 is cleaned. In the present embodiment manganese is utilized to form the precursor 436 and the second seed layer 307, but in alternative embodiments aluminum, tin, or titanium may be utilized to form the precursor 436 and the second seed layer 307.

In step 528, after the catalytic CVD processing chamber 418 is cleaned, the method of forming a semiconductor integrated circuit interconnect structure with a multi-layered seed layer proceeds back to step 500. In step 500, source gases which include copper(II) chloride gas 402 and hydrogen gas 408 are provided. In step 502, the source gases are released into a catalytic chemical vapor deposition chamber 418, wherein the catalytic CVD processing chamber 418 includes a wafer directly on a heatable plate 426. In step 504, a metal wire 420 is heated. Next, in step 506 the metal wire 420 that is sufficiently heated causes the copper(II) chloride gas 402 to react with the hydrogen gas 408, at the surface of metal wire 420, such that the copper(II) chloride gas 402 decomposes into copper radicals 422. In step 507, a determination is made as to whether a second seed layer 307 has been formed. Since a second seed layer 307 has been formed the process will proceed to step 509. In step 509, the copper radicals 422 are deposited directly on the second seed layer 307, wherein a second copper seed layer 308 (shown in FIG. 3A) is formed. In step 510, a determination is made as to whether a second copper seed layer has been formed. Since the second copper seed layer 308 has been formed the process will end at step 530, wherein the formation of the multi-layered seed layer is completed.

The method flow diagram depicted in FIG. 5 illustrates a method for forming a multi-layered seed layer of a semiconductor integrated circuit interconnect structure, according to various embodiments of the present invention. It should also be noted that, in some alternative implementations, the process steps noted in the blocks may occur out of the order noted in the figures. For example, two blocks shown in succession may, in fact, be performed substantially concurrently, or the blocks may sometimes be performed in the reverse order, depending upon the process involved. It will also be noted that each block of the block diagram and/or flowchart illustration, and combinations of blocks in the block diagram and/or flowchart illustration, can be implemented by special purpose hardware-based systems that perform the specified processes or acts, or combinations of special purpose hardware and computer instructions.

Furthermore, those skilled in the art will note from the above description, that presented herein is a novel apparatus and method for forming a multi-layered seed layer to minimize electromigration, utilizing sequential catalytic chemical vapor deposition. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A method of performing a sequential catalytic chemical vapor deposition (CVD) process by utilizing a catalytic CVD apparatus, the method comprising the steps of:
    forming one or more openings in a dielectric layer;
    forming a barrier metal layer disposed on the dielectric layer;
    forming a multi-layered seed layer disposed on the barrier metal layer, wherein the multi-layered seed layer comprises at least three layers that include a first copper seed layer, a second seed layer disposed on the first copper seed layer, and a second copper seed layer disposed on the second seed layer;
    forming an electroplated copper layer disposed on the multi-layered seed layer;
    forming a planarized surface, wherein a portion of the barrier metal layer, the multi-layered seed layer, and the electroplated copper layer are removed; and
    forming a capping layer disposed on the planarized surface, wherein the capping layer is formed at temperatures high enough to enhance copper grain growth of the first copper seed layer and the second copper seed layer, and wherein the temperature is high enough to enhance diffusion of the second seed layer with the first copper seed layer, with the second copper seed layer, and with the electroplated copper layer to form a single metal layer.

2. The method of claim 1, wherein the one or more openings further comprises a trench area, a trench area with one or more via holes, or a combination thereof.

3. The method of claim 1, wherein the second seed layer comprises manganese, aluminum, tin, or titanium.

4. The method of claim 1, wherein the multi-layered seed layer is formed utilizing a sequential catalytic chemical vapor deposition (CVD) process, and wherein the sequential catalytic chemical vapor deposition is performed by utilizing a catalytic chemical vapor deposition apparatus.

5. The method of claim 1, wherein the electroplated copper layer is formed at a temperature between about 50° C.-250° C.

6. The method of claim 1, wherein the capping layer is a dielectric capping layer, or is a dielectric capping layer deposited on a selective metal capping layer.

* * * * *